(12) United States Patent
Aviram et al.

(10) Patent No.: US 6,689,540 B2
(45) Date of Patent: Feb. 10, 2004

(54) POLYMERS AND USE THEREOF

(75) Inventors: Ari Aviram, Croton-on-Hudson, NY (US); C. Richard Guarnieri, Somers, NY (US); Wu-Song Huang, Poughkeepsie, NY (US); Ranee W. Kwong, Wappingers Falls, NY (US); David R. Medeiros, Yorktown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/040,446

(22) Filed: Jan. 9, 2002

(65) Prior Publication Data

US 2002/0090574 A1 Jul. 11, 2002

Related U.S. Application Data

(62) Division of application No. 09/593,704, filed on Jun. 15, 2000, now Pat. No. 6,346,362.

(51) Int. Cl.[7] .................................................. G03F 7/40
(52) U.S. Cl. ........................ 430/296; 430/325; 430/326; 430/323; 430/967; 430/942; 216/49; 216/64; 216/66; 216/67
(58) Field of Search .............................. 216/49, 64, 66, 216/67; 430/325, 326, 296, 323, 967, 942

(56) References Cited

U.S. PATENT DOCUMENTS

| | | | |
|---|---|---|---|
| 4,791,171 A | 12/1988 | Cunningham | 525/100 |
| 5,024,916 A | 6/1991 | Steinmann et al. | 430/325 |
| 5,100,762 A | 3/1992 | Tanaka et al. | 430/270.1 |
| 5,482,816 A | 1/1996 | Murata et al. | 430/325 |
| 5,510,230 A * | 4/1996 | Tennant et al. | 430/325 |
| 5,552,260 A | 9/1996 | Vogel et al. | 430/270.1 |
| 5,580,695 A | 12/1996 | Murata et al. | 430/325 |
| 5,952,150 A | 9/1999 | Ohta et al. | 430/326 |
| 5,985,524 A * | 11/1999 | Allen et al. | 430/326 |

OTHER PUBLICATIONS

Graft copolymer, Academic Press Dictionary of Science and Technology, Harcourt:AP Dictionare of Science and Technology, Jttp://www.harcourt.com/dictionary/def/4/4/7/2/4472300.html, online dictionary, printed Mar. 10, 2001, copyright Harcurt, Inc.one page.*

Graft, yourDictionary.com, Merriam–Websters Collegiate Dictionary, on line, two pages, printed Mar. 10, 2001, copyright, yourDictionary.com Inc, 2000.*

* cited by examiner

Primary Examiner—Cynthia Hamilton
(74) Attorney, Agent, or Firm—Connolly Bove Lodge & Hutz LLP; Daniel P. Morris

(57) ABSTRACT

Compositions comprising a polymer having silicon, germanium and/or tin; and a protecting group grafted onto a polymeric backbone are useful as resists and are sensitive to imaging irradiation while exhibiting enhanced resistance to reactive ion etching.

18 Claims, 3 Drawing Sheets

Method 1

100nm L/S 14 µC/cm²     75nm L/S 15 µC/cm²

POLYMERS AND USE THEREOF

FEDERALLY SPONSORED RESEARCH AND DEVELOPMENT

This invention was supported by DARPA ETECH Contract 1999.

TECHNICAL FIELD

The present invention relates to certain polymers that are useful as resists and that exhibit enhanced resistance to plasma and especially to $Cl_2/O_2$ plasma used in reactive ion etching. The present invention is concerned with the compositions as well as their use in lithography. For instance, the materials of the present invention are suitable for use in device and mask fabrication on optical, e-beam, x-ray and ion-beam lithography tools.

BACKGROUND OF INVENTION

In the manufacture of patterned devices and especially microelectronic devices, the processes of etching different layers that constitute the finished product are among the most crucial steps involved. One method widely employed in the etching process is to overlay the surface to be etched with a suitable mask.

The mask is typically created by imagewise forming a pattern of resist material over those areas of the substrate to be shielded from the etching. The resist is normally formed of a polymeric organic material. The pattern is formed by imagewise exposing the resist material to irradiation by lithographic techniques. The irradiation employed is usually x-ray, UV radiation, electron beam radiation or ion-beam radiation.

Radiation sensitive materials and/or compositions are either positive-acting (i.e. radiation solubilizable) or negative-acting (i.e. radiation insolubilizable or radiation crosslinkable). Positive-working (radiation) sensitive compositions are rendered soluble (or developable) by actinic radiation (deep-near UV, x-ray, electron-beam or ion-beam) and can be removed using selective developing solutions leaving unexposed areas intact. Negative-working (radiation) sensitive compositions are those which become insoluble upon exposure to actinic radiation. Selected solutions can dissolve and remove the unexposed areas of the composition while leaving the exposed portions intact. Development of such exposed materials yields negative tone images.

After the resist is developed forming the desired mask, the substrate and mask can be immersed in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the resolution considered necessary to achieve optimum dimensions consistent with current processing requirements.

Moreover, such wet etching processes are undesirable because of the environmental and safety concerns associated therewith.

Accordingly, various so-called "dry processes" have been suggested to improve the process from an environmental viewpoint, as well as to reduce the relative cost of the etching. Furthermore, these "dry processes" have the potential advantage of greater process control and higher aspect ratio images. Also, when fabricating patterns having feature sizes below 350 nm, dry etching processes are necessary for profile control.

Such "dry processes" generally involve passing a gas through a container and creating a plasma in this gas. The species in this gas are then used to etch a substrate placed in the chamber or container. Typical examples of such "dry processes" are plasma etching, sputter etching, and reactive ion etching.

Reactive ion etching provides well-defined, vertically etched sidewalls.

One of the challenges in the fabrication of microelectronic devices and masks is to develop a resist which exhibits good lithographic performance as well as high dry etch resistance for subsequent pattern transfer into an underlying substrate. The dry etch chemistries include $O_2$ currently used for antireflective coatings, $Cl_2/O_2$ currently used for chrome etching in mask fabrication, $Cl_2$ based plasma for polysilicon etch, and fluorocarbon based plasmas such as $CF_4$ for oxide etching. These plasmas are examples only and are not meant to limit the scope. Conventional novolak/diazonapthoquinone resists used for i-line lithography have to date exhibited excellent dry etch resistance to which other resist materials are compared.

Moreover, chemically amplified resists are employed extensively in the electronics industry. The chemically amplified resists are typically based on polyhydroxy styrene and other polymeric backbones that undergo deprotection when a photoacid generator, which is incorporated in the formulation, is exposed to actinic radiation.

The performance of these chemically amplified resists to withstand reactive ion etching in $Cl_2/O_2$ plasma requires improvement. Accordingly, a need exists to develop radiation sensitive compositions that provide improved dry etch resistance for use in mask fabrication (binary, attenuating phase shift masks, alternating phase shift masks) and for device fabrication.

SUMMARY OF INVENTION

The present invention provides compositions that are useful as resists and that are sensitive to imaging radiation that exhibits enhanced resistance to reactive ion etching. The compositions of the present invention typically exhibit enhanced resistance to reactive ion etching using, in particular, $Cl_2/O_2$ plasmas, $Cl_2$ plasmas, $O_2$ plasmas and fluorocarbon plasmas.

In particular, the polymers of the present invention are polymers comprising a polymeric backbone having grafted thereon at least one element selected from the group consisting of silicon, germanium and tin and mixtures thereof; and a protecting group.

The present invention also relates to a method for forming a pattern of a photoresist. The method comprises:

a) providing on a substrate a layer of a photoresist composition comprising a polymer having a polymeric backbone and grafted thereon at least one element selected from the group consisting of silicon, germanium, tin and mixtures thereof; and a protecting group;

b) imagewise exposing the layer to actinic radiation in a pattern to thereby cause a change in the solubility of the photoresist where exposed; and c) developing the photoresist to thereby form the pattern.

A further aspect of the present invention relates to forming a pattern on a substrate. The method comprises:

a) providing a layer to be patterned on a substrate;

b) providing on the layer to be patterned a layer of a resist composition which comprises a polymer comprising a polymeric backbone having grafted thereon at least one member selected from the group consisting of silicon, germanium, tin and mixtures thereof; and a protecting group;

c) imagewise exposing the layer of resist composition to irradiation;

d) developing the resist to form the desired pattern; and e) subjecting the layer to be patterned to reactive ion etching with the resist acting as a mask to thereby form the desired pattern on the substrate.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The polymers according to the present invention are obtained from the incorporation onto a polymeric backbone at least one member selected from the group consisting of silicon, germanium and tin and mixtures thereof; and a protecting group.

The polymeric backbone is typically a polymer containing phenolic OH groups such as polyhydroxystyrene, copolymers of hydroxystyrene; and phenolic polymers. Examples of copolymers of hydroxystyrene are copolymers with alkyl ($C_1$–$C_8$) acrylates, alkyl ($C_1$–$C_8$) methacrylates and/or styrene. Such copolymers typically contain at least about 60 percent by weight of hydroxystyrene. Specific copolymers include:

Copolymer of hydroxystyrene (65%) and tert.-butylmethacrylate (35%);

Terpolymer of hydroxystyrene (65%), tert.-butylmethacrylate (15%) and styrene (20%);

Terpolymer of hydroxystyrene (60%), tert.-butylmethacrylate (20%), styrene (20%); and Terpolymer of hydroxystyrene (70%), tert.-butylmethacrylate (10%), styrene (20%).

Typically, the molecular weight (weight average) of the polymeric backbone is about 1500–10000.

It has been found pursuant to the present invention that grafting of silicon, germanium and/or tin (via organometallic compound) and preferably germanium onto the polymeric backbone improves the resistance of the polymer to such harsh conditions as $Cl_2O_2$ plasma, while at the same time preserving the lithographic properties of the polymeric backbone. The use of generally tin leads to negative acting resists while germanium and silicon give positive acting resists.

Suitable organometallic compounds that can be employed pursuant to the present invention include 4-trimethylgermanium-1-α,α-dimethyl benzylalcohol, 4 trimethylgermanium-alphamethylstyrene, 4 trimethyltin-alphamethylstyrene, and 4 trimethyl silylalphamethylstyrene.

The amount of silicon, germanium and/or tin grafted is typically about 3% to about 30% by weight based upon the total weight of the grafted polymer. In the case of germanium, the more typical range is about 3% to about 15% and in the case of silicon the more typical range is about 12% to about 30%.

The polymer also includes protecting groups which block or mask the reactive OH moieties of the polymeric backbone. Typically, the amount of protecting groups is about 10 to about 40% by weight based upon the polymeric backbone. The protecting group inhibits dissolution of the polymer it is until reacted.

Examples of suitable protecting groups are acetals, ketals, tertiary alkyl carbonates, tertiary alkyl ethers, and tertiary alkyl esters.

The polymers can be prepared by dissolving the polymeric backbone in a suitable solvent such as acetonitrile and grafting the reactive organometallic compound onto the backbone in the presence of an acid catalyst.

Figure 1:
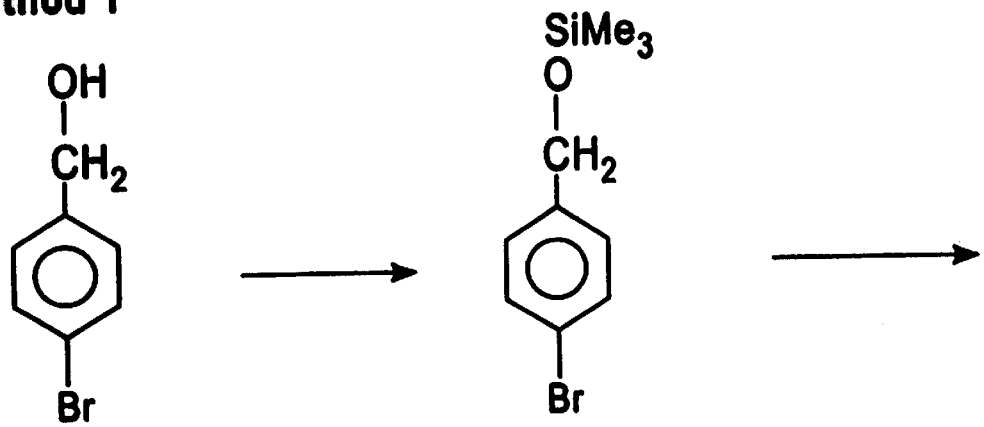
FIGS. 1 and 2 illustrate reaction sequences for synthesizing polymers according to the present invention.
Figure 1:
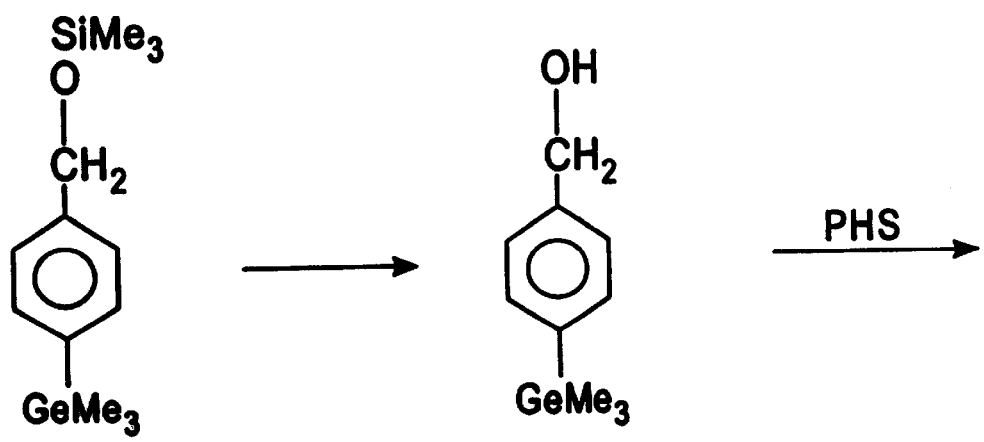
Figure 1:
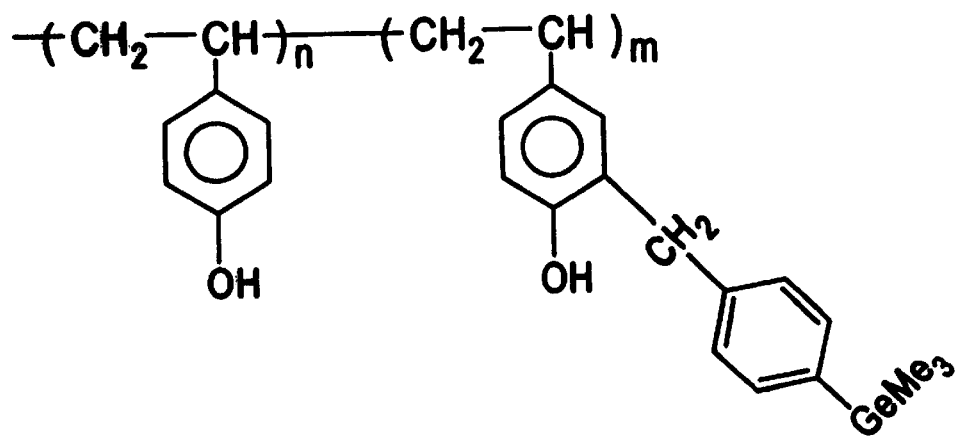
Figure 2:
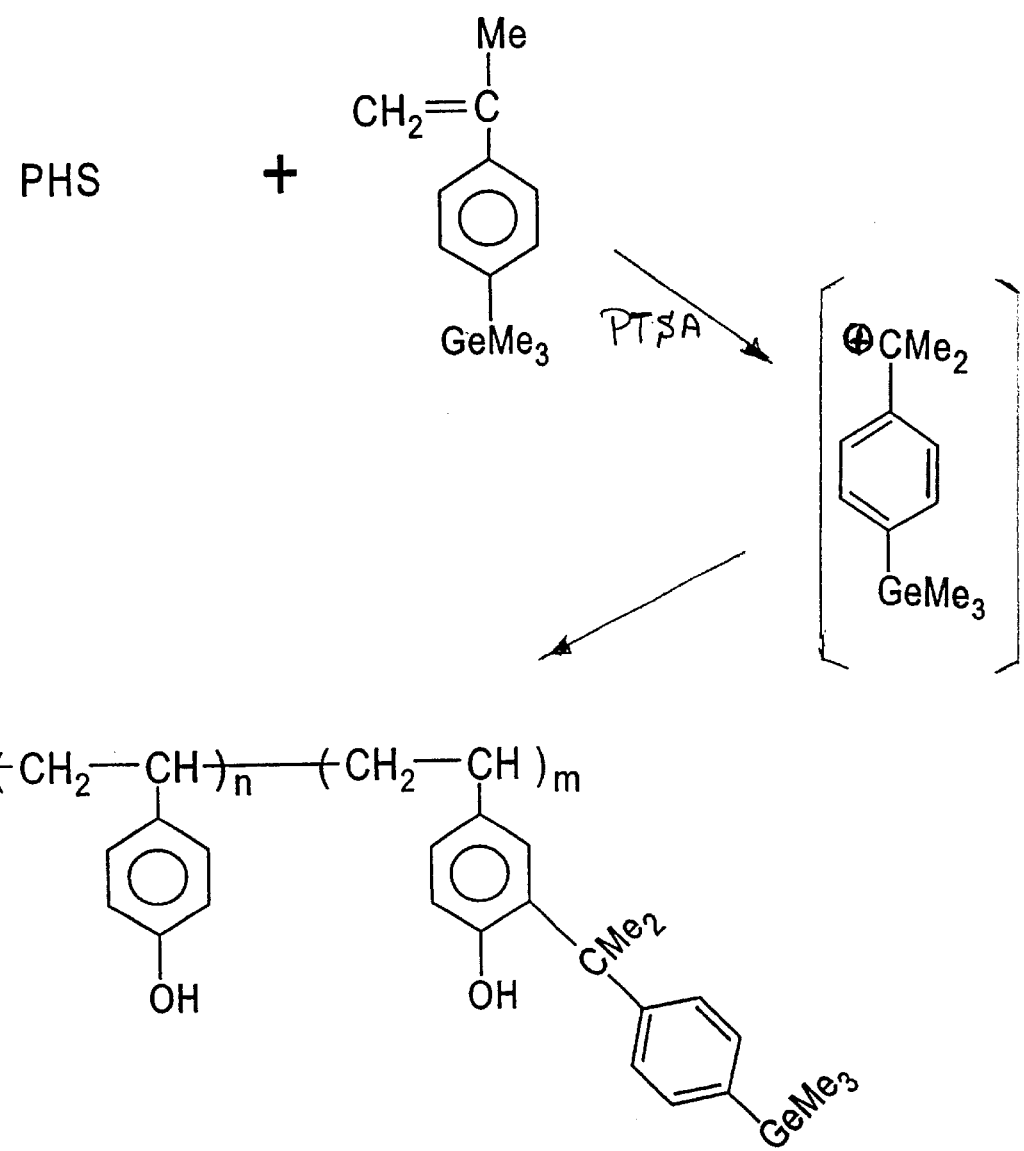

FIGS. 1 and 2 show the synthetic sequences to the grafted species and to the grafting reaction. Both sequences work well but the one shown in FIG. 2 is simpler and was used more often. The figures depict sequences for incorporation of germanium but the same sequences work with tin and silicon. The only substitution would be trialkyl tin chloride or trialkyl silyl chloride for the trimethylgermanium chloride.

The polymers of the present invention can be employed as solutions in a suitable solvent such as a 10 weight % solution in propylene glycol methylacetate.

The polymers of the present invention can be developed employing tetramethylammoniumhydroxide.

The following illustrates a typical fabrication sequence for making optical masks for microlithography by providing a pattern of chromium metal on a quartz plate by the following steps:

1. A thin film of chromium metal is provided on the surface of a quartz plate.

2. The metal layer is coated with e-beam resist.

3. The resist is patterned by e-beam.

4. The plate is developed in a suitable developer.

5. The exposed chromium film is etched either by wet etch or by dry etch.

6. The residual resist is removed.

The following non-limiting examples are presented to further illustrate the present invention.

EXAMPLE 1

Synthesis of 4-trimethylgermanium-alpha-methylstyrene

A Grigniard solution of 4-chloro-alpha-methylstyrene in tetrahydrofurane is prepared from about 4 g magnesium and about 5 g of the 4-chloro-alpha-methylstyrene. About 5 g of chlorotrimethyl germanium are added dropwise and the solution is refluxed for about 24 hours. After cooling, a saturated solution of ammonium chloride in water is added. Also added are about 300 ml of diethyl ether. The organic layer is separated and the aqueous phase is extracted with additional diethyl ether. The organic solutions are combined, dried over sodium sulphate and then the solvents are removed. The product is distilled at 75° C./0.1 mm.

The corresponding silicon and tin compounds can be prepared by the same process except that trimethyl silyl chloride and trialkyl tin chloride, respectively, are used in place of the trimethyl germanium chloride.

EXAMPLE 2

Synthesis of Ge Grafted Polymer

About 18 grams of poly(hydroxystyrene) (PHS) is dissolved in about 300 ml of acetonitrile. About 12 g of 4-trimethylgermanium-alphamethyl styrene are added to the solution. About 40 mg of p-toluenesulfonic acid are then added to the solution. The solution is refluxed for about 24 hours and after cooling, about ten drops of ammonium hydroxide are added. The solution is poured into water and the precipitate is filtered. The solid is dried in air and in high vacuum and suspended in about 200 ml hexane to remove any residual starting materials. This is followed by filtration and drying.

EXAMPLE 3

Grafting with Benzyl Alcohol

Example 2 is repeated except that 4-trimethylgermanium-1-α,α-dimethyl benzylalcohol is employed in place of the 4-trimethylgermanium-alpha-methyl styrene.

EXAMPLE 4

Synthesis of Ge Grafted Polymer

About 18 grams (g) of poly(hydroxystyrene) (PHS) is dissolved in about 300 ml acetic acid. About 12 g of 4-trimethylgermanium-alpha-methyl styrene is added to the solution. About 100 mg of p-toluenesulfonic acid are then added. The solution is refluxed for about 24 hours and after cooling, about ten drops of ammonium hydroxide are added. The solution is poured into water and the precipitate is filtered. The solid is washed with aqueous sodium bicarbonate (5%). The solid is dried in air and in high vacuum.

The dry solid is placed in a Soxhlet apparatus and extracted with hexane for 24 hours to remove any traces of organic small molecules. The resulting solid is dried in vacuum. This method produces some PHS acetate as evidenced from IR spectroscopy of the product.

Figure 3:
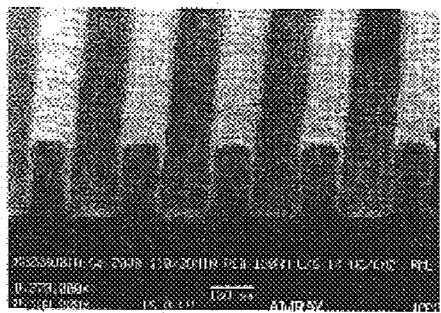
FIG. 3 shows e-beam lithographic images at 75 KeV of films containing germanium and ketal protecting groups.
Figure 3:
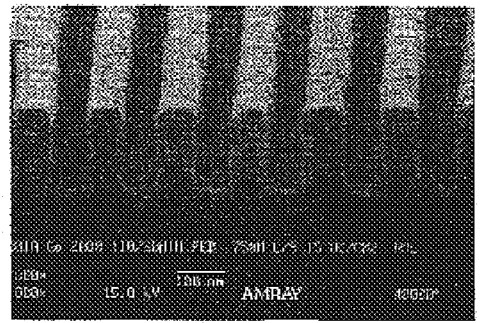

FIG. 3 shows e-beam lithographic images at 75 KeV, of films containing 4.2% germanium and protected with methoxy cyclohexyl ketal protective groups. Also, the following Table 1 illustrates the dramatic effect of incorporation of germanium into resist films, on the RIE etch rates in two different plasmas.

TABLE 1

RIE Etch Rates for Ge Resists

| Material | $O_2$ nm/sec. | Cl/O nm/sec. |
| --- | --- | --- |
| 4.3% Ge In Resist | 5.6 | 1.35 |
| 3.1% Ge In Resist | 6.5 | 1.4 |
| 2.15% Ge in Resist | 7.2 | 1.47 |
| 0.43% Ge In Resist | 9.5 | 1.55 |
| 0% Ge In Resist | 10.6 | 1.55 |

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for forming a pattern of a photoresist which comprises:
   a) providing on a substrate a layer of a photoresist composition comprising a grafted polymer having a polymeric backbone and grafted thereon at least one element selected from the group consisting of silicon, germanium, tin and mixtures thereof, and a protecting group wherein the grafted element is at least one member selected from the group consisting of 4-trimethylgermanium-1-α, α dimethyl benzylalcohol, 4 trimethylgermanium-alphamethylstyrene, 4 trimethyl tin-alpha methylstyrene or 4 trimethyl silyl alpha methyl styrene;
   b) imagewise exposing the layer to actinic radiation in a pattern to thereby cause a change in the solubility of the photoresist where exposed; and
   c) developing the photoresist to thereby form the pattern.

2. The process of claim 1 wherein the irradiation comprises UV irradiation with wavelengths below 365 nm.

3. The process of claim 1 wherein the irradiation comprises x-ray irradiation.

4. The process of claim 1 wherein the irradiation comprises electron-beam irradiation.

5. The process of claim 1 wherein the irradiation comprises extreme UV irradiation (EUV).

6. The process of claim 1 wherein the irradiation comprises ion-beam irradiation.

7. The process of claim 1 wherein the developer comprises tetramethylammonium hydroxide.

8. A method for forming a pattern on a substrate which comprises:
   a) providing a layer to be patterned on a substrate;
   b) providing on the layer to be patterned, a layer of a resist composition which comprises a grafted polymer comprising a polymeric backbone having grafted thereon at least one element selected from the group consisting of silicon, germanium, tin and mixtures thereof, and a protecting group, wherein said grafted element is at least one member selected from the group consisting of 4-trimethylgermanium-1-α, α dimethyl benzylalcohol, 4 trimethylgermanium-alphamethylstyrene, 4 trimethyl tin-alpha methylstyrene or 4 trimethyl silyl alpha methyl styrene;
   c) imagewise exposing the layer of resist composition to irradiation;
   d) developing the resist to form the desired pattern; and
   e) subjecting the layer to be patterned to reactive ion etching with the resist acting as a mask to thereby form the desired pattern on the substrate.

9. The process of claim 8 wherein the reactive ion etching comprises a Cl$_2$ plasma.

10. The process of claim 8 wherein the reactive ion etching comprises an O$_2$ plasma.

11. The process of claim 8 wherein the reactive ion etching comprises a fluorocarbon plasma.

12. The process of claim 8 wherein the irradiation comprises deep UV irradiation with wavelengths below 240 nm.

13. The process of claim 8 wherein the irradiation comprises x-ray irradiation.

14. The process of claim 8 wherein the irradiation comprises electron-beam irradiation.

15. The process of claim 8 wherein the irradiation comprises extreme UV irradiation.

16. The process of claim 8 wherein the irradiation comprises ion-beam irradiation.

17. A method for forming a pattern on a substrate which comprises:
   a) providing a layer to be patterned on a substrate;
   b) providing on the layer to be patterned, a layer of a resist composition which comprises a polymer comprising a polymeric backbone having grafted thereon at least one element selected from the group consisting of silicon, germanium, tin and mixtures thereof; and a protecting group;
   c) imagewise exposing the layer of resist composition to irradiation;
   d) developing the resist to form the desired pattern; and
   e) subjecting the layer to be patterned to reactive ion etching with the resist acting as a mask to thereby form the desired pattern on the substrate wherein the reactive ion etching comprises a Cl$_2$/O$_2$ plasma.

18. A method for forming a pattern on a substrate which comprises:
   a) providing a layer to be patterned on a substrate;
   b) providing on the layer to be patterned, a layer of a resist composition which comprises a polymer comprising a polymeric backbone having grafted thereon at least one element selected from the group consisting of silicon, germanium, tin and mixtures thereof; and a protecting group, wherein said grafted element is at least one member selected from the group consisting of 4-trimethylgermanium-1-α, α dimethyl benzylalcohol, 4 trimethylgermanium-alphamethylstyrene, 4 trimethyl tin-alpha methylstyrene or 4 trimethyl silyl alpha methyl styrene;
   c) imagewise exposing the layer of resist composition to irradiation;
   d) developing the resist to form the desired pattern wherein the developer comprises tetramethylammonium hydroxide; and
   e) subjecting the layer to be patterned to reactive ion etching with the resist acting as a mask to thereby form the desired pattern on the substrate.

* * * * *